United States Patent
Agrawal et al.

(10) Patent No.: US 9,419,629 B1
(45) Date of Patent: Aug. 16, 2016

(54) DELAY-LOCKED LOOP CIRCUIT WITH FRACTIONAL PHASE FREQUENCY DETECTOR

(71) Applicant: FREESCALE SEMICONDUCTOR, INC., Austin, TX (US)

(72) Inventors: Gaurav Agrawal, Aligarh (IN);
Deependra K. Jain, Noida (IN);
Krishna Thakur, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 15/058,121

(22) Filed: Mar. 1, 2016

(51) Int. Cl.
| | |
|---|---|
| H03L 7/06 | (2006.01) |
| H03L 7/081 | (2006.01) |
| H03L 7/091 | (2006.01) |
| H03L 7/089 | (2006.01) |
| H03L 7/093 | (2006.01) |
| H03K 5/14 | (2014.01) |
| H03K 5/00 | (2006.01) |

(52) U.S. Cl.
CPC .............. *H03L 7/0812* (2013.01); *H03K 5/14* (2013.01); *H03L 7/0891* (2013.01); *H03L 7/091* (2013.01); *H03L 7/093* (2013.01); *H03K 2005/00019* (2013.01)

(58) Field of Classification Search
USPC ................................. 327/147–149, 156–158
See application file for complete search history.

(56) References Cited

U.S. PATENT DOCUMENTS

| | | | |
|---|---|---|---|
| 7,157,949 B2 | 1/2007 | Chen | |
| 7,209,533 B1 | 4/2007 | Nguyen | |
| 7,233,182 B1* | 6/2007 | Savoj | H03L 7/0812 327/141 |
| 8,368,445 B2* | 2/2013 | Lin | H03L 7/095 327/149 |
| 8,698,527 B2* | 4/2014 | Moon | H03L 7/0814 327/149 |
| 8,917,128 B1* | 12/2014 | Baek | H03L 7/0812 327/149 |
| 2003/0076142 A1* | 4/2003 | Ko | H03L 7/0812 327/158 |
| 2005/0238129 A1* | 10/2005 | Ishida | G11B 20/18 375/376 |
| 2009/0243679 A1* | 10/2009 | Smith | H03L 7/07 327/158 |
| 2010/0013530 A1* | 1/2010 | Kim | H03K 5/1565 327/149 |
| 2012/0328065 A1* | 12/2012 | Burg | H03L 7/113 375/376 |
| 2013/0222026 A1* | 8/2013 | Havens | H03L 7/0995 327/158 |

OTHER PUBLICATIONS

Park et al., "A Low-Jitter Delay-Locked Loop with Harmonic-Lock Prevention", IEICE Trans. Fundamentals, vol. E85-A, No. 2, Feb. 2002.

* cited by examiner

*Primary Examiner* — Adam Houston
(74) *Attorney, Agent, or Firm* — Charles E. Bergere

(57) ABSTRACT

A delay-locked loop (DLL) has a fractional phase frequency (PF) detector that reduces false locking and harmonic locking. The PF detector has a trunk, an upper branch, a lower branch, and a logic module. A delay line provides the PF detector a set of fractional phase-delayed clock signals that are used to prime and/or activate corresponding flip-flops of the trunk, upper branch, and lower branch in a sequence. The use of flip-flops in the lower branch activated by different fractional phase-delayed clock signals avoids false locking and harmonic locking over a wider range of initial delay magnitudes than conventional DLLs.

11 Claims, 7 Drawing Sheets

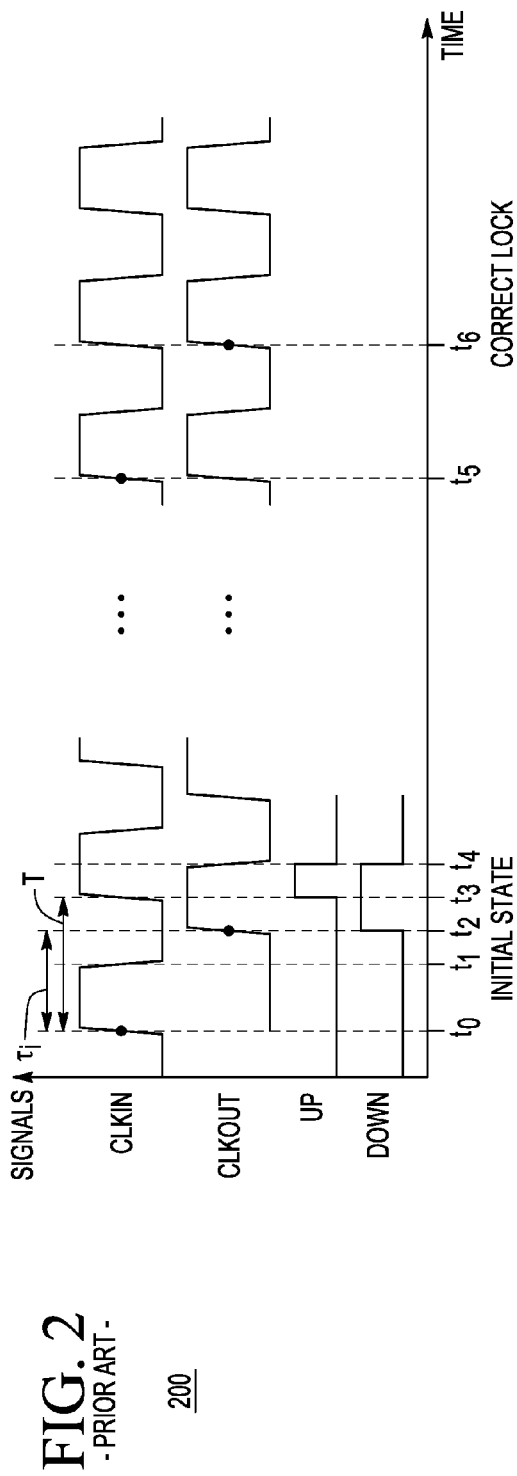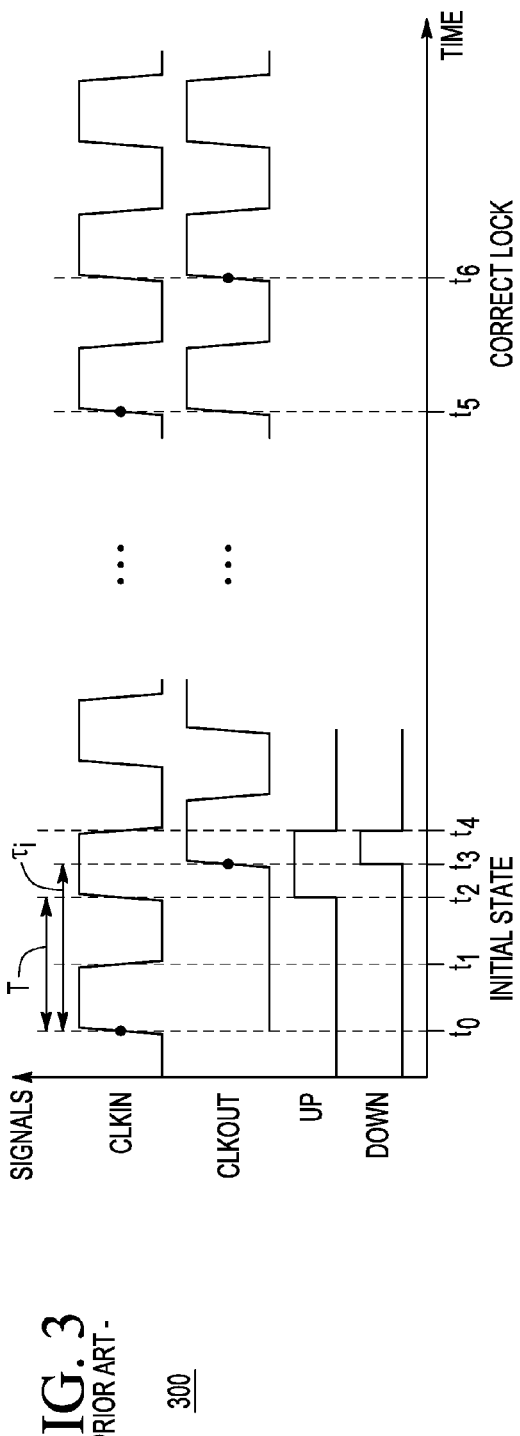
FIG. 2 -PRIOR ART-
FIG. 3 -PRIOR ART-

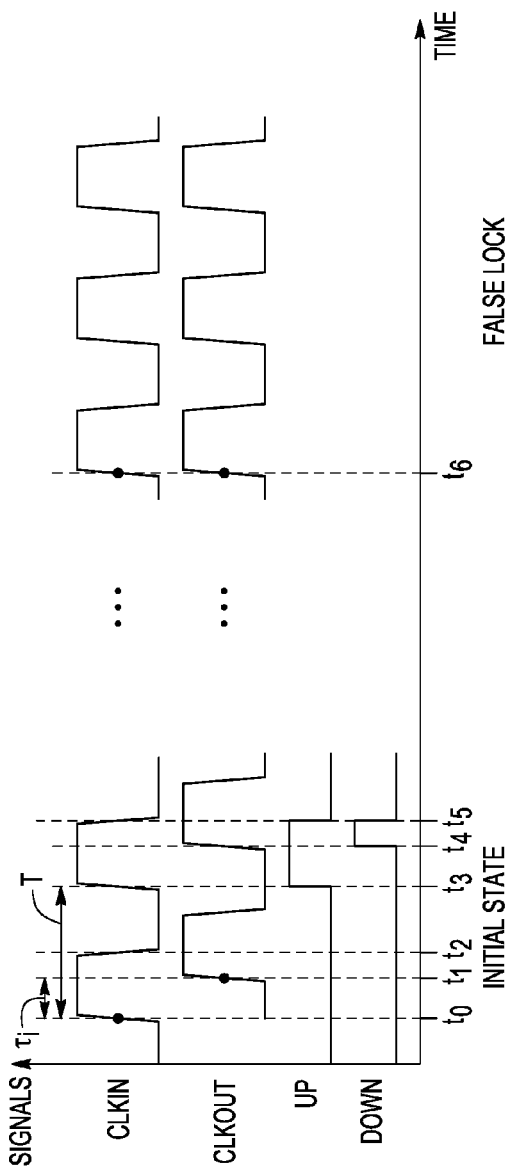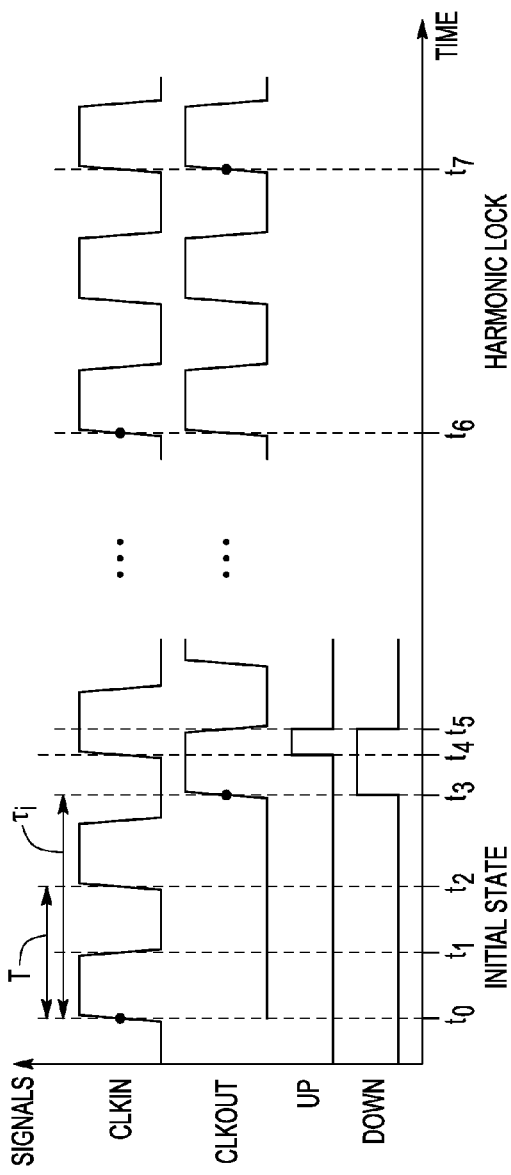
FIG. 4 -PRIOR ART-
400
FIG. 5 -PRIOR ART-
500

DELAY-LOCKED LOOP CIRCUIT WITH FRACTIONAL PHASE FREQUENCY DETECTOR

BACKGROUND

The present invention relates to timing circuits and, more particularly, to a delay-locked loop (DLL) circuit having a phase frequency detector.

FIG. 1 is a simplified block diagram of a conventional DLL 100. The DLL 100 may be used, for example, in a clock recovery system, an on-chip clock distribution system, or in a clock generator. The DLL 100 comprises a phase frequency (PF) detector 101, a charge pump 102, a capacitor AH, and a voltage-controlled delay (VCD) line 103.

The DLL 100 is expected to generate an output clock CLKOUT that has the same frequency as an input clock CLKIN and that is delayed by the VCD line 103 by exactly one period T of the input clock CLKIN. An initial delay $\tau_i$ introduced by the VCD line depends on various initial conditions, including the initial charge on the capacitor AH after power up. The DLL 100 is adapted to correct an initial delay $\tau_i$ that is within the range of $T/2 < \tau_i < 3Y/2$ so that, after several cycles, the actual delay $\tau$ applied by the VCD line 103 equals the period T.

As explained in further detail below, the PF detector 101 controls the phase delay generated by the VCD line 103 based on a comparison of the input clock CLKIN to the output clock CLKOUT, which is fed back to the PF detector 101 from the VCD line 103. Based on the detected phase difference between the input clock CLKIN and the output clock CLKOUT, the PF detector 101 raises or lowers—using corresponding control signals UP and DOWN—a current output by the charge pump 102 to a node 102a. The node 102a corresponds to a first terminal of the capacitor AH. The second terminal of the capacitor AH is connected to a common ground node. Note that the capacitor AH acts as a low-pass filter for the DLL 100. The control voltage $V_{CTRL}$ at the node 102a rises or falls depending on the current provided by the charge pump 102 to the node 102a.

The control signal UP is used to raise the control voltage $V_{CTRL}$. The control signal DOWN is used to lower the control voltage $V_{CTRL}$. When the UP signal is high and the DOWN signal is low, the capacitor AH charges and the control voltage $V_{CTRL}$ increases. When the UP control signal is low and the DOWN control signal is high, the capacitor AH discharges and the control voltage $V_{CTRL}$ decreases. When both UP signal and DOWN signal are high, the charge on capacitor AH is held steady. When both the UP signal and the DOWN signal are low, the charge on capacitor AH is similarly held steady.

The VCD line 103 comprises a plurality of buffers (not shown) connected in a serial chain, where the input to the first buffer is the input clock CLKIN and the output of the last buffer is the output clock CLKOUT. The delay introduced by each buffer is controlled by the control voltage $V_{CTRL}$, which is provided to each buffer. Specifically, increasing the control voltage $V_{CTRL}$ decreases the delay, and decreasing the control voltage $V_{CTRL}$ increases the delay. The cumulative delay of all of the buffers of the VCD line 103 is the actual delay T.

The PF detector 101 comprises two D flip-flops 105 and 106 and an AND gate 104. The D input of each of the flip-flops 105 and 106 is connected to a supply voltage $V_{DD}$. The reset input of each of the flip-flops 105 and 106 is connected to the output 104a of the AND gate 104. The clock inputs of the flip-flops 105 and 106 are connected, respectively, to the input clock CLKIN and the output clock CLKOUT. The Q outputs of the flip-flops 105 and 106 are, respectively, the UP signal on a node 101a and DOWN signal on a node 101b, which are also the inputs to the AND gate 104.

When a rising edge of the input clock CLKIN is received by the clock input of the flip-flop 105, the flip-flop 105 propagates the high ($V_{DD}$) value at its D input, and the UP signal output via its Q output goes high. When a rising edge of the output clock CLKOUT is received by the clock input of the flip-flop 106, the flip-flop 106 propagates the high value ($V_{DD}$) at its D input, and the DOWN signal output via its Q output goes high. When both the UP and DOWN signals are high, then the output 104a of the AND gate 104 goes high and resets both flip-flops 105 and 106, and both the UP and DOWN signals go low. Note that the operation of the PF detector 101 may be controlled by a PFD power-up control (not shown) to either provide power for normal operation of the PF detector 101 or cut off power to hold the signals of the PF detector 101 low.

FIG. 2 is an exemplary timing diagram 200 for the DLL 100 of FIG. 1 for an exemplary initial delay $\tau_i$ that is too short. Note that the black circles on the wave forms in FIG. 2 indicate exemplary corresponding upticks of the input clock CLKIN and the output clock CLKOUT. At time $t_0$, the input clock CLKIN goes high. At time $t_1$, the PF detector 101 is powered up. At time $t_2$, the output clock CLKOUT goes high, and the DOWN signal follows substantially simultaneously. At time $t_3$, the input clock CLKIN goes high, and the UP signal follows substantially simultaneously. After a short delay, at time $t_4$, the flip-flops 106 and 105 are reset, and the UP and DOWN signals go low.

The period T of the input clock CLKIN corresponds to the difference between times $t_3$ and $t_0$. The initial delay $\tau_i$ corresponds to the difference between times $t_2$ and $t_0$. As can be seen, $T/2 < \tau_i < T$. While the DOWN signal is high and the UP signal is low—i.e., between times $t_2$ and $t_3$—the charge pump 102 lowers the control voltage $V_{CTRL}$ at the node 102a and, consequently, increases the delay introduced by the VCD line 103. Based on this initial delay $\tau_i$ and depending on a variety of other factors collectively referred to as the loop bandwidth of the DLL 100, it takes several cycles of the input clock CLKIN for the DLL 100 to achieve phase lock. At time $t_5$, after phase lock has been achieved, the input clock CLKIN goes high. At time $t_6$, after a delay $\tau$ of T, the output clock CLKOUT also goes high.

FIG. 3 is an exemplary timing diagram 300 for the DLL 100 of FIG. 1 for an exemplary initial delay $\tau_i$ that is too long. At time $t_0$, the input clock CLKIN goes high. At time $t_1$, the PF detector 101 is powered up. At time $t_2$, the input clock CLKIN goes high, and the UP signal follows substantially simultaneously. At time $t_3$, the output clock CLKOUT goes high, and the DOWN signal follows substantially simultaneously. After a short delay, at time $t_4$, the flip-flops 106 and 105 are reset, and the UP and DOWN signals go low.

The period T of the input clock CLKIN corresponds to the difference between times $t_2$ and $t_0$. The initial delay $\tau_i$ corresponds to the difference between times $t_3$ and $t_0$. As can be seen, $T < \tau_i < 3T/2$. While the UP signal is high and the DOWN signal is low—i.e., between times $t_2$ and $t_3$—the charge pump 102 raises the control voltage $V_{CTRL}$ at the node 102a and, consequently, reduces the delay introduced by the VCD line 103. Based on this initial delay $\tau_i$ and depending on the loop bandwidth of the DLL 100, it takes several cycles of the input clock CLKIN for the DLL 100 to achieve phase lock. At time $t_5$, after phase lock has been achieved, the input clock CLKIN goes high. At time $t_6$, after a delay $\tau$ of T, the output clock CLKOUT also goes high.

FIG. 4 is an exemplary timing diagram 400 for the DLL 100 of FIG. 1 for an exemplary initial delay $\tau_i$ that is excessively short. At time to, the input clock CLKIN goes high. At time $t_1$, the output clock CLKOUT goes high. At time $t_2$, the PF detector 101 is powered up. At time $t_3$, the input clock CLKIN goes high, and the UP signal follows substantially simultaneously. At time $t_4$, the output clock CLKOUT goes high, and the DOWN signal follows substantially simultaneously. After a short delay, at time $t_5$, the flip-flops 106 and 105 are reset, and the UP and DOWN signals go low.

The period T of the input clock CLKIN corresponds to the difference between times $t_3$ and to. The initial delay $\tau_i$ corresponds to the difference between times $t_1$ and $t_0$. As can be seen, $\tau_i < T/2$. While the UP signal is high and the DOWN signal is low, i.e., between times $t_3$ and $t_4$, the charge pump 102 raises the control voltage $V_{CTRL}$ at the node 102a and, consequently, reduces the delay introduced by the VCD line 103. Based on this initial delay $\tau_i$ and depending on the loop bandwidth of the DLL 100, it takes several cycles of the input clock CLKIN for the DLL 100 to achieve phase lock. Note, however, that this is an undesired false lock. At time $t_6$, after false phase lock has occurred, the input clock CLKIN goes high, and, substantially simultaneously, the output clock CLKOUT follows.

FIG. 5 is an exemplary timing diagram 500 for the DLL 100 of FIG. 1 for an exemplary initial delay $\tau_i$ that is excessively long. At time to, the input clock CLKIN goes high. At time $t_1$, the PF detector 101 is powered up. At time $t_2$, the input clock CLKIN goes high again. At time $t_3$, the output clock CLKOUT goes high, and the DOWN signal follows substantially simultaneously. At time $t_4$, the input clock CLKIN goes high, and the UP signal follows substantially simultaneously. After a short delay, at time $t_5$, the flip-flops 106 and 105 are reset, and the UP and DOWN signals go low.

The period T of the input clock CLKIN corresponds to the difference between times $t_2$ and to. The initial delay $\tau_i$ corresponds to the difference between times $t_3$ and to. As can be seen, $3T/2 < \tau_i$. While the DOWN signal is high and the UP signal is low—i.e., between times $t_3$ and $t_4$—the charge pump 102 lowers the control voltage $V_{CTRL}$ at the node 102a and, consequently, increases the delay introduced by the VCD line 103. Based on this initial delay $\tau_i$ and depending on the loop bandwidth of the DLL 100, it takes several cycles of the input clock CLKIN for the DLL 100 to achieve phase lock. Note, however, that this is an undesired harmonic lock. At time $t_6$, after harmonic phase lock has occurred, the input clock CLKIN goes high. At time $t_7$, 2T later, the output clock CLKOUT follows.

Both false lock and harmonic lock are undesirable conditions for the DLL 100. False locking or harmonic locking are problematic if, for example, the circuit containing the DLL 100 relies on intermediate signals from the VCD line 103 to generate signals. Some prior-art solutions for harmonic lock include the addition of circuitry to detect a harmonic lock situation and provide an alert. Some other prior-art solutions include additional circuitry to prevent harmonic lock for initial delays of up to 2T. Other solutions may provide additional benefits.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements. Note that elements in the figures are not drawn to scale.

FIG. 2 is an exemplary timing diagram for the DLL of FIG. 1 for an initial delay that is too short;

FIG. 3 is an exemplary timing diagram for the DLL of FIG. 1 for an initial delay that is too long;

FIG. 4 is an exemplary timing diagram for the DLL of FIG. 1 for an initial delay that is excessively short;

FIG. 5 is an exemplary timing diagram for the DLL of FIG. 1 for an initial delay that is excessively long;

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

In one embodiment, a PF detector includes logic that uses fractional phase signals from the VCD line to prevent (i) false lock and (ii) harmonic lock of delays greater than the period T of an input clock. As noted above, a VCD line comprises a plurality of buffers serially connected in a chain. The output of each buffer other than the last one is provided to the next buffer in the VCD line. Two or more of these outputs may also be fed back to the PF detector to be used by the logic of the PF detector.

Figure 1:
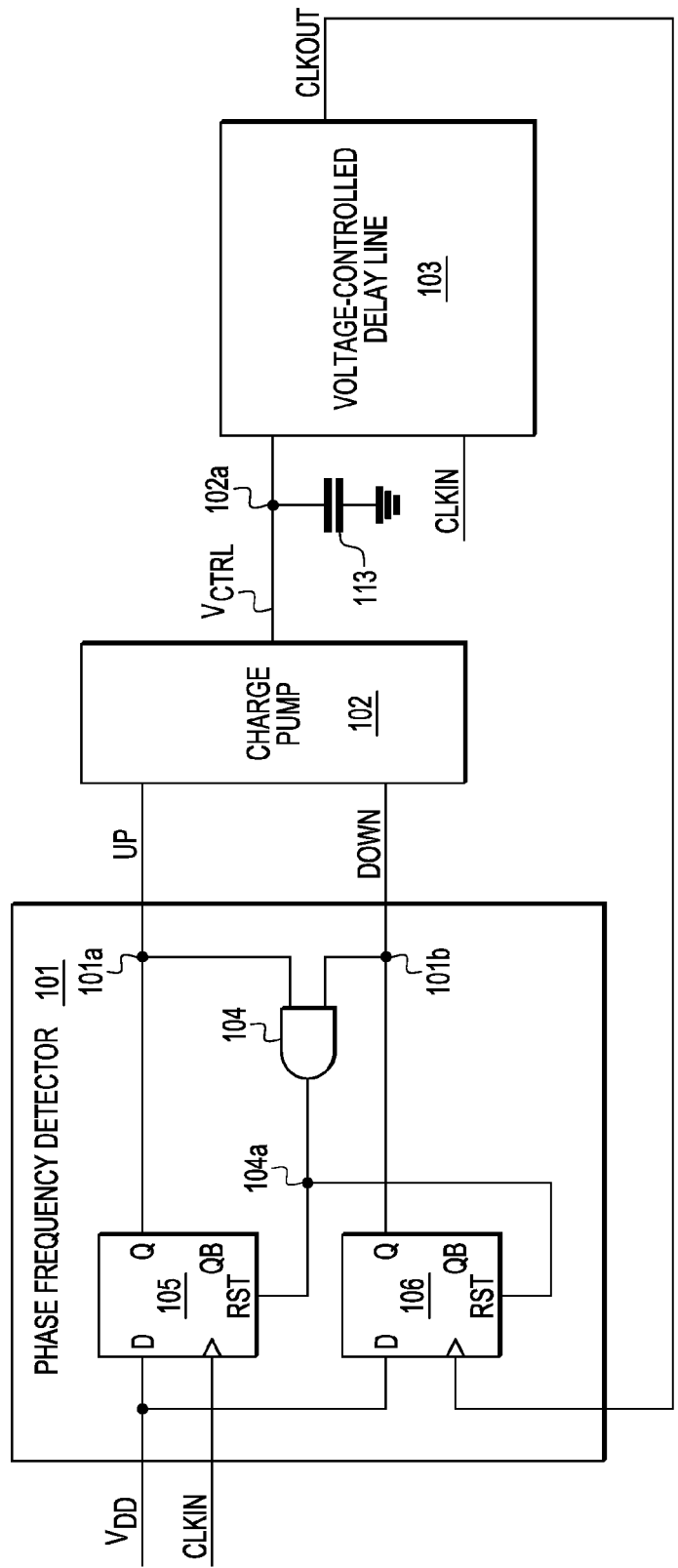
FIG. 1 is a simplified schematic block diagram of a conventional DLL.
Figure 6:
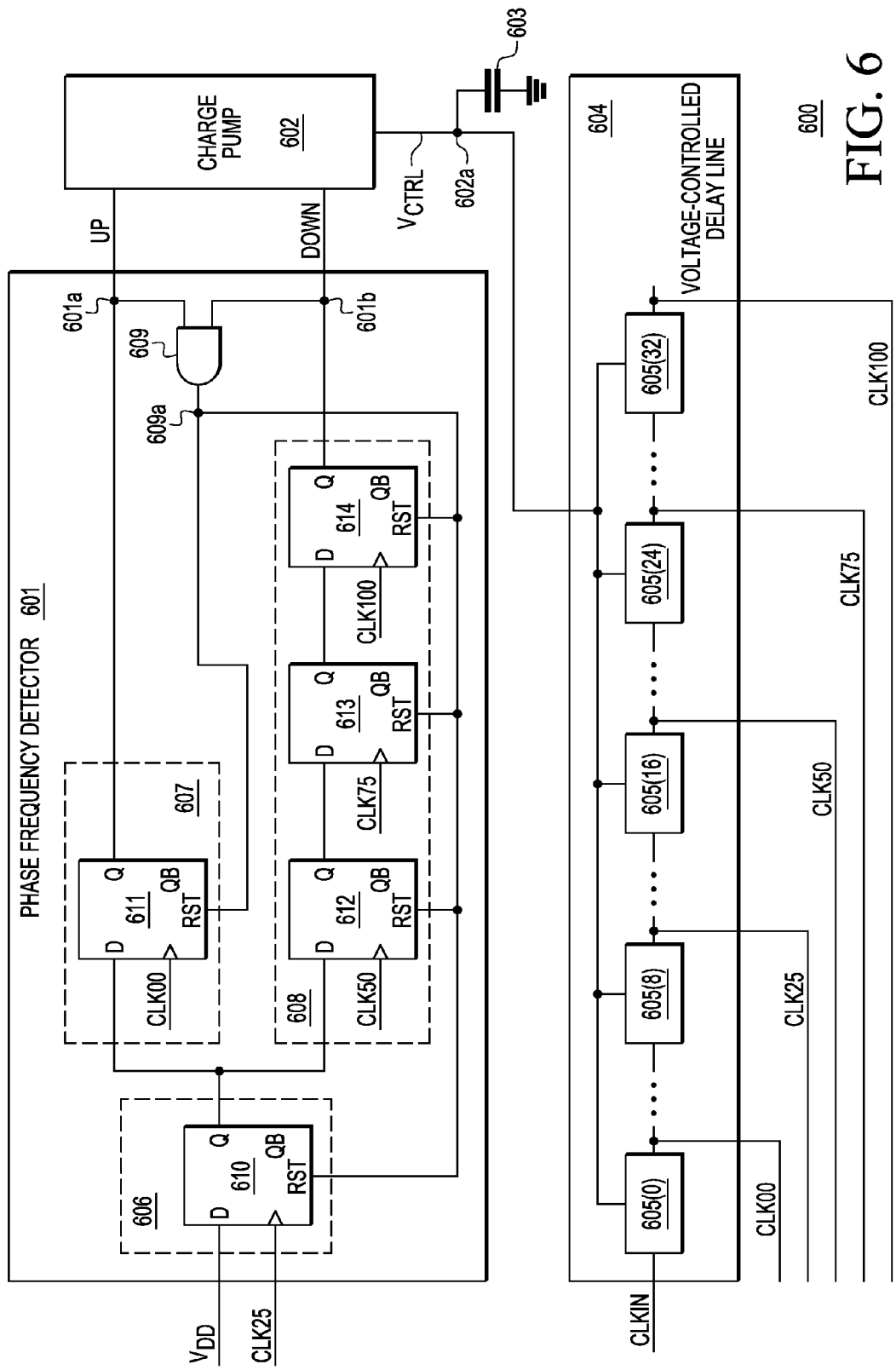
FIG. 6 is a simplified schematic block diagram of a DLL in accordance with one embodiment of the invention.

Referring now to FIG. 6, a simplified schematic block diagram of a DLL 600 in accordance with one embodiment of the invention is shown. The DLL 600 comprises a PF detector 601, a charge pump 602, a capacitor 603, and a VCD line 604. The charge pump 602 and the capacitor 603 are substantially identical to the corresponding charge pump 102 and capacitor AH of FIG. 1—i.e., the charge pump 602 controls the control voltage $V_{CTRL}$ at the node 602a. Unless described otherwise, the components of the DLL 600 operate substantially identically to the corresponding components of the DLL 100 of FIG. 1 described above.

The VCD line 604 comprises 33 buffers 605(0)-605(32) serially connected in the form of a chain. Each buffer 605 delays its input clock signal by $\tau/32$ to generate its corresponding output clock signal, where $\tau$ is the current phase delay between clock signals CLK00 and CLK100. Note that any clock signal output by, or input to, any of the buffers 605 may be referred to as a fractional delay signal. As explained above in reference to VCD line 103 of FIG. 1, each buffer 605 receives the control voltage $V_{CTRL}$ as an input, which determines the magnitude of the delay τ/32 introduced by each of the buffers 605.

The buffer 605(0) receives the input clock CLKIN as an input and provides a fractional delay signal CLK00 as an output. The buffer 605(8) receives the output of the buffer 605(7) (not shown) as its input and outputs a fractional delay signal CLK25 having a fractional phase delay of τ/4 relative to the clock signal CLK00. The buffer 605(16) receives the output of the buffer 605(15) (not shown) as its input and outputs a fractional delay signal CLK50 having a fractional phase delay of τ/2 relative to the fractional delay signal CLK00. The buffer 605(24) receives the output of the buffer 605(23) (not shown) as its input and outputs a fractional delay signal CLK75 having a fractional phase delay of 3τ/4 relative to the fractional delay signal CLK00. The buffer 605(32) receives the output of the buffer 605(31) (not shown) as its input and outputs a fractional delay signal CLK100 having the full phase delay of τ relative to the fractional delay signal CLK00.

Note that the fractional delay signal CLK00 is delayed by τ/32 relative to CLKIN; however, as explained below, the PF detector 601 uses the signal CLK00 and not the input clock CLKIN as an input.

The PF detector 601 comprises a trunk 606, an upper branch 607, a lower branch 608, and an AND logic gate 609. The trunk 606 comprises a flip-flop 610. The upper branch 607 comprises a flip-flop 611. The lower branch 608 comprises three flip-flops 612, 613, and 614 connected in series. Note that all of the flip-flops 610, 611, 612, 613, and 614 may be identical to each other. The reset inputs of all of the flip-flops 610, 611, 612, 613, and 614 are connected to the output 609a of the AND gate 609.

The D inputs of the flip-flops (1) 610, (2) 611, (3) 612, (4) 613, and (5) 614 are connected to, respectively, (1) a supply voltage $V_{DD}$, (2) a Q output of the flip-flop 610, (3) a Q output of the flip-flop 610, (4) a Q output of the flip-flop 612, and (5) a Q output of the flip-flop 613. The clock inputs of the flip-flops (1) 610, (2) 611, (3) 612, (4) 613, and (5) 614 are connected to, respectively, the signals (1) CLK25, (2) CLK00, (3) CLK50, (4) CLK75, and (5) CLK100.

The inputs to the AND gate 609 are the outputs of the upper and lower branches 607 and 608—in other words, the Q outputs of, respectively, the flip-flops 611 and 614. The output of the upper branch 607 is an UP control signal provided to the charge pump 602 on a node 601a. The output of the lower branch BN is a DOWN control signal to the charge pump 602 on a node 601b. As illustrated below, the arrangement and the inputs of the flip-flops of the trunk 606, the upper branch 607, and the lower branch 608 of the PF detector 601, by their triggering logic, help reduce the probability of false locking or harmonic locking and increase the delay range that can be captured and corrected for a successful lock.

If the delay τ applied by the VCD line 604 is less than the period T of the signal CLK00, then, following an uptick of the signal CLK25, the signals CLK50, CLK75, and CLK100 will uptick in succession before signal CLK00 upticks again. This means that—due to the interconnections of the Q outputs and the D inputs described above—the flip-flops of the lower branch 608 will activate before the flip-flop of the upper branch 607 activates. Note that, as used herein and unless otherwise indicated, a flip-flop is considered activated if its Q output is high. Note that, as used herein, each of the trunk 606, the upper branch 607, and the lower branch 608 is considered activated when all of its flip-flops are activated. Because the lower branch 608 activates before the upper branch 607 activates, the signal DOWN will go high while the signal UP is low and, as a result, the delay τ will be increased. Once the signal CLK00 subsequently upticks, the signal UP goes high and, after a short delay, the PF detector 601 resets. The above cycle then repeats until the delay τ increases to be substantially equal to the period T and the DLL 600 achieves phase lock.

If, on the other hand, the delay τ is greater than the period T, but less than 4*T, then, following an uptick of the signal CLK25—which primes the first flip-flops of the upper branch 607 and the lower branch 608—the signal CLK00 will uptick before all of the flip-flops of the lower branch 608 activate. Note that, as used herein and unless otherwise indicated, a flip-flop is considered primed if its D input is high and its Q output is low such that an uptick on its clock input will cause its Q output to go high. As a result of the activation of the flip-flop 611, the signal UP goes high while the signal DOWN is low, and, as a result, the delay τ will be reduced. Once the signal CLK100 upticks—following upticks of the signals CLK50 and CLK75, whose successive upticks activate the flip-flops 612 and 613 of the lower branch 608—the flip-flop 614 is activated and the signal DOWN goes high and, after a short delay, the PF detector 601 resets. The above cycle then repeats until the delay τ decreases to be substantially equal to the period T and the DLL 600 achieves phase lock.

The operation of the PF detector 601 may be further controlled by a power-up signal (not shown) which is provided by a circuit comprising the DLL 600. In a first state, the power-up signal forces the Q outputs of all of the flip-flops of the PF detector 601 to be low regardless of the states of the D and clock inputs of the flip-flops. In a second state, the power-up signal allows those flip-flops to function normally. Depending on the particular implementation, the power-up signal may connect to, for example, the reset inputs of the flip-flops, to the supply voltage $V_{DD}$, and/or to set inputs (not shown) of the flip-flops.

Figure 7:
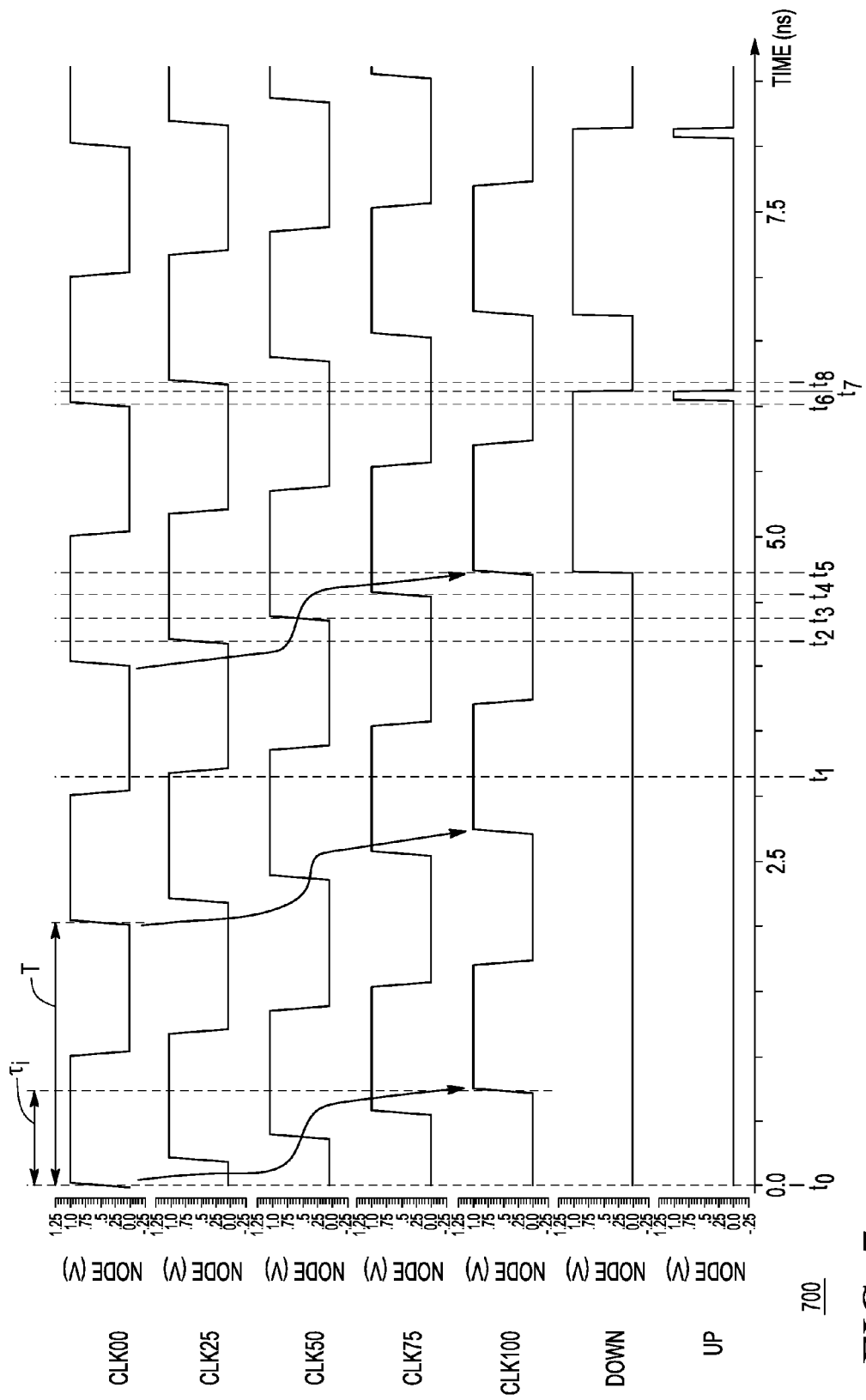
FIG. 7 is an exemplary timing diagram for the DLL of FIG. 6 for an initial delay that is less than T/2.

FIG. 7 is an exemplary timing diagram 700 for the DLL 600 of FIG. 6 for an exemplary initial delay $\tau_i$ of approximately 0.3*T, where T is the period of the input clock signal CLKIN. Curved arrows show the delays between selected corresponding upticks of the signals CLK00 and CLK100. At time t0, after the components of the DLL 600—other than the PF detector 601—are powered up, the signal CLK00 upticks. The signals CLK25, CLK50, CLK75, and CLK100 follow at delays of $\tau_i/4$, $\tau_i/2$, $3\tau_i/4$, and $\tau_i$, respectively. At time $t_1$, the PF detector 601 is powered up. Initially, the Q outputs of all of the flip-flops 610, 611, 612, 613, and 614 of the PF detector 601 are low. At time $t_2$, the signal CLK25 upticks for the first time since time $\tau_i$ and, consequently, the Q output of flip-flop 610—connected to the D inputs of the flip-flops 611 and 612—goes high. As a result, the first flip-flops of the upper and lower branches 607 and 608—namely, the flip-flops 611 and 612—get primed.

At time $t_3$, the signal CLK50 goes high and, consequently, the Q output of the flip-flop 612 goes high and the flip-flop 613 is primed. At time $t_4$, the signal CLK75 goes high and, consequently, the Q output of the flip-flop 613 goes high and the flip-flop 614 is primed.

At time to, the signal CLK100 goes high and, consequently, the Q output of the flip-flop 614—corresponding to the signal DOWN—goes high. As a result, the delay of the VCD line 604 increases. At time $t_6$, the signal CLK00 upticks and, consequently, the Q output of the flip-flop 611—corresponding to the signal UP—goes high. As a result the output of the AND gate 609 goes high and, after a short delay, at time $t_7$, all the flip-flops—namely the flip-flops 610, 611, 612, 613, and 614—of the PF detector 601 are reset and the signals UP and DOWN go low. At time $t_8$, the signal CLK25 upticks and the above-described cycle repeats.

Note that, for an initial delay $\tau_i$ in the range $T/2<\tau_i<3T/2$, the DLL 600 will operate in a similar manner to correct the actual delay $\tau$ to the period T to achieve correct delay lock.

Figure 8:
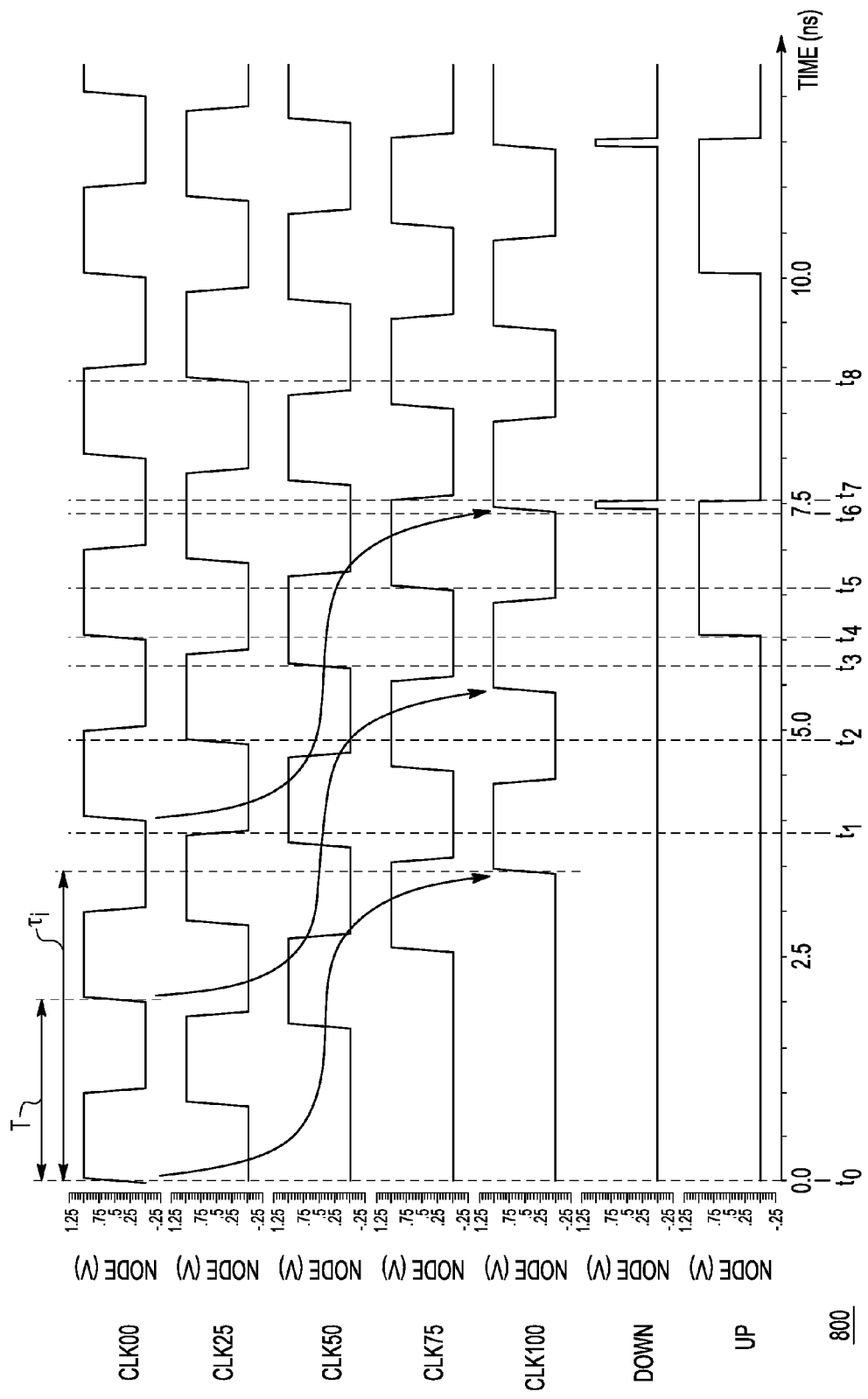
FIG. 8 is an exemplary timing diagram for the DLL of FIG. 6 for an initial delay that is greater than 3T/2 and less than 2T.

FIG. 8 is an exemplary timing diagram 800 for the DLL 600 of FIG. 6 for an exemplary initial delay $\tau_i$ of approximately 1.6*T. At time $t_0$, after the components of the DLL 600—other than the PF detector 601—are powered up, the signal CLK00 upticks. The signals CLK25, CLK50, CLK75, and CLK100 follow at delays of $\tau_i/4$, $\tau_i/2$, $3\tau_i/4$, and $\tau_i$, respectively. At time $t_1$, the PF detector 601 is powered up. Initially, the Q outputs of all of the flip-flops of the PF detector 601 are low. Then, at time $t_2$, the signal CLK25 upticks for the first time since time $t_1$ and, consequently, the Q output of flip-flop 610—connected to the D inputs of the flip-flops 611 and 612—goes high. As a result, the flip-flops 611 and 612 are primed.

At time $t_3$, the signal CLK50 goes high and, consequently, the Q output of the flip-flop 612 goes high and the flip-flop 613 is primed. At time $t_4$, the signal CLK00 goes high and, consequently, the Q output of the flip-flop 611—corresponding to the signal UP—goes high. As a result, the delay of the VCD line 604 decreases. At time $t_0$, the signal CLK75 goes high and, consequently, the Q output of the flip-flop 613 goes high and the flip-flop 614 is primed.

At time $t_6$, the signal CLK100 goes high and, consequently, the Q output of the flip-flop 614—corresponding to the signal DOWN—goes high. As a result, the output of the AND gate 609 goes high and, after a short delay, at time $t_7$, all of the flip-flops of the PF detector 601 are reset and the signals UP and DOWN go low. At time $t_8$, the signal CLK25 upticks and the above-described cycle repeats.

Figure 9:
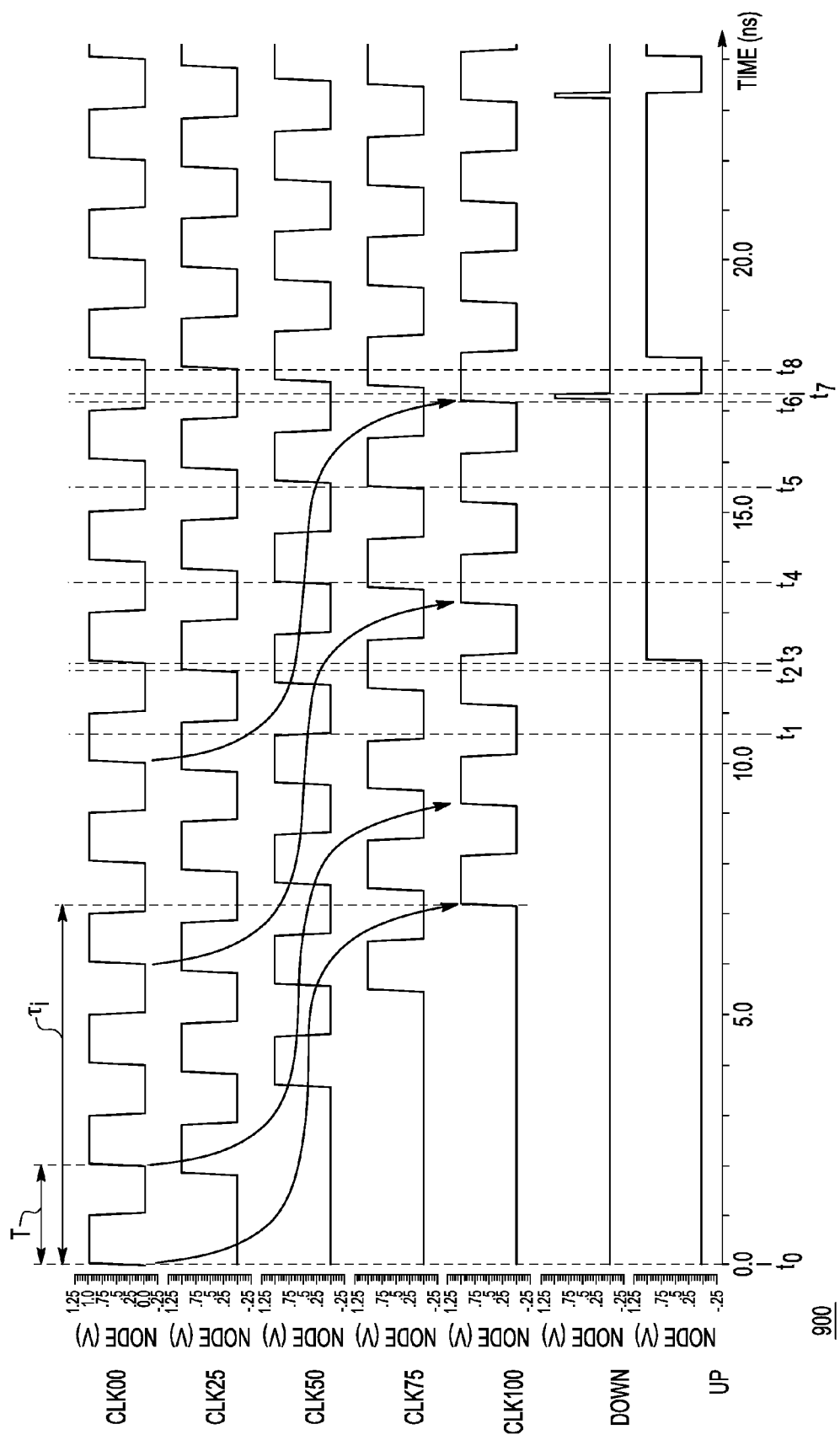
FIG. 9 is an exemplary timing diagram for the DLL of FIG. 6 for an initial delay that is greater than 7T/2 and less than 4T.

FIG. 9 is an exemplary timing diagram 900 for the DLL 600 of FIG. 6 for an exemplary initial delay $\tau_i$ of approximately 3.6*T. At time $t_0$, after the components of the DLL 600—other than the PF detector 601—are powered up, the signal CLK00 upticks. The signals CLK25, CLK50, CLK75, and CLK100 follow at delays of $\tau_i/4$, $\tau_i/2$, $3\tau_i/4$, and $\tau_i$, respectively. At time $t_1$, the PF detector 601 is powered up. Initially, the Q outputs of all of the flip-flops of the PF detector 601 are low. At time $t_2$, the signal CLK25 upticks for the first time since time $t_1$ and, consequently, the Q output of flip-flop 610—connected to the D inputs of the flip-flops 611 and 612—goes high. As a result, the flip-flops 611 and 612 are primed.

At time $t_3$, the signal CLK00 goes high and, consequently, the Q output of the flip-flop 611—corresponding to the signal UP—goes high. As a result, the delay of the VCD line 604 decreases. At time $t_4$, the signal CLK50 goes high and, consequently, the Q output of the flip-flop 612 goes high and the flip-flop 613 is primed. At time $t_0$, the signal CLK75 goes high and, consequently, the Q output of the flip-flop 613 goes high and the flip-flop 614 is primed.

At time $t_6$, the signal CLK100 goes high and, consequently, the Q output of the flip-flop 614—corresponding to the signal DOWN—goes high. As a result, the output of the AND gate 609 goes high and, after a short delay, at time $t_7$, all of the flip-flops of the PF detector 601 are reset and the signals UP and DOWN go low. At time $t_8$, the signal CLK25 upticks and the above-described cycle repeats.

An embodiment of the invention has been described where the upper branch 607 and the lower branch 608 comprise particular numbers of flip-flops. The invention is not, however, so limited. In some alternative embodiments of the invention, the lower branch 608 comprises more or fewer than three flip-flops, activated by suitable different corresponding fractional-delay clock signals from the VCD line 604. In one exemplary alternative embodiment, the lower branch 608 comprises only the flip-flop 614, which is connected to be primed by the flip-flop 610 of the trunk 606 and activated by the signal CLK100. Note that increasing the number of flip-flops in the lower branch 608 increases the range of delays greater than the period T which can be correctly locked while avoiding harmonic locking. In some implementations, a correction range of $2n*T$ approximately corresponds to $2^n+1$ fractional signals and corresponding flip-flops.

An embodiment of the invention has been described where the trunk 606 is activated by a fractional-delay clock signal CLK25 corresponding to a $\tau/4$ delay. The invention is not, however, so limited. In some alternative embodiments, the trunk 606 is activated by a fractional-delay clock signal corresponding to a fractional delay other than $\tau/4$ that is greater than 0 and less than $\tau$.

An embodiment of the invention has been described where the VCD line 604 comprises a particular plurality of buffers. The invention is not, however, so limited. In alternative implementations, the VCD line 604 may have any other number of buffers providing correspondingly different fractional delay signals for use by the PF detector 601. Generally, the VCD line 604 should have more buffers than there are flip-flops in the lower branch 608.

Note that alternative embodiments may have a different number of fractional delay signals provided by the delay line to the PF detector. Preferably, the delays between sequential fractional delay signals are equal. In other words, if M fractional delay signals are provided to the PF detector in addition to CLK00 and CLK100, where M is a positive integer, then the fractional delay signals would be separated by $\tau/(1+M)$ from the adjacent fractional delay signals. So for M=1, they would be $\tau/2$ apart; for M=2, they would be $\tau/3$ apart; for M=3, they would be $\tau/4$ apart; and so on.

An embodiment of the invention has been described where the clock signal CLK00 is the output of the first buffer 605(0) and the clock signal CLK100 is the output of the last buffer 605(0). The invention is not, however so limited. In some alternative embodiments, the input clock signal CLKIN is used instead of the output of the first buffer. In some alternative embodiments, CLK00 is the output of a buffer 605 other than the first buffer 605 of the VCD line 604. In some alternative embodiments, CLK100 is the output of a buffer 605 other than the last buffer of the VCD line 604. Note that in the alternative embodiments, the phase delay between the clock signals CLK00 and CLK100 remains $\tau$, which, when properly delay locked, equals the period T.

Embodiments of the invention have been described using particular logic components and circuits. It should be noted that alternative embodiments may comprise different logic components and circuits that, in combination, perform the same functions as the described embodiments. Alternative embodiments may, for example, include using complementary gates, inverted signals, and/or downtick triggering.

Embodiments of the invention have been described as using flip-flops. However, the invention is not so limited. Some alternative embodiments use other suitable data modules instead of flip-flops such as, for example, latches.

An embodiment of the invention has been described where the DLL comprises a voltage-control delay line. The invention is not, however, so limited. In some alternative embodiments, the VCD line is replaced by a current-controlled delay line. Some of these alternative embodiments may include a voltage-controlled current source for converting the control voltage $V_{CTRL}$ into a corresponding current for provision to the buffers of the current-controlled delay line.

Embodiments of the invention have been described where the desired delay is the period T of the input clock signal. However, the invention is not so limited. In some alternative embodiments, the desired delay may be, for example, a multiple of T greater than 1.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. A delay-locked loop (DLL) circuit that receives an input clock signal and generates an output clock signal having a desired phase delay relative to the input clock signal, the DLL circuit comprising:
   a delay line that receives the input clock signal and a delay-line control signal and generates a plurality of fractional delay signals having different phase delays relative to the input clock signal whose magnitudes are based on the delay-line control signal;
   a phase frequency (PF) detector that receives the plurality of fractional delay signals from the delay line and generates UP and DOWN control signals based on the plurality of fractional delay signals;
   a charge pump that receives the UP and DOWN control signals and generates a pump current based on the UP and DOWN control signal; and
   a loop filter that receives the pump current and generates the delay-line control signal based on the pump current, wherein the PF detector comprises:
      a trunk activated by a fractional delay signal of the plurality of fractional delay signals;
      an upper branch primed by the trunk and activated by a fractional delay signal of the plurality of fractional delay signals; and
      a lower branch primed by the trunk and comprising a serial chain of one or more data modules that are sequentially activated by one or more of the plurality of fractional delay signals, wherein the DLL converges to the desired phase delay over a range of initial phase delay magnitudes.

2. The circuit of claim 1, wherein:
   the delay line is a voltage-controlled delay line; and
   the delay-line control signal is a control voltage $V_{CTRL}$ that is provided to each buffer of the plurality of buffers to control the delay introduced by the buffer.

3. The circuit of claim 1, wherein the loop filter comprises a capacitor connected between the charge pump and a common ground node and adapted to receive the pump current.

4. The circuit of claim 1, wherein:
   the plurality of fractional delay signals includes a first fractional delay signal, a last fractional delay signal, and M intermediate fractional delay signals, where M is a positive integer;
   after the DLL converges, the phase delay between the first and last fractional delay signals is equal to the desired phase delay;
   the delay line comprises a plurality of identical buffers;
   the plurality of buffers comprises at least M+1 buffers; and
   the delay introduced by each buffer of the plurality of buffers is $\tau/y$, where $\tau$ is the delay between the first and last fractional delay signals and y is an integer greater than M.

5. The circuit of claim 4, wherein:
   the fractional delay signal that activates the trunk is a first intermediate fractional delay signal of the M intermediate fractional delay signals;
   the fractional delay signal that activates the upper branch is the first fractional delay signal; and
   the fractional delay signals that sequentially activate the lower branch comprise the last fractional delay signal and the intermediate fractional delay signals other than the first intermediate fractional delay signal.

6. The circuit of claim 4, wherein:
   the trunk comprises a first data module that is:
      adapted to be primed by a voltage source $V_{DD}$; and
      connected to be activated by a first intermediate fractional delay signal having a phase delay of $\tau/4$; and
      adapted to provide an output;
   the upper branch comprises a data module that is:
      adapted to be primed by the output of the trunk;
      connected to be activated by the first fractional delay signal having a phase delay of 0; and
      adapted to output the UP control signal;
   the lower branch comprises a first, second, and third data modules;
   the first data module is:
      adapted to be primed by the output of the trunk;
      connected to be activated by a second intermediate fractional delay signal having a phase delay of $\tau/2$; and
      adapted to provide an output;
   the second data module is:
      adapted to be primed by the output of the first data module;

connected to be activated by a third intermediate fractional delay signal having a phase delay of 3τ/4; and
adapted to provide an output; and the third data module is:
adapted to be primed by the output of the second data module;
connected to be activated by the last fractional delay signal having a phase delay of τ; and
adapted to provide the DOWN control signal.

7. The circuit of claim 6, wherein:
each of the data modules is a flip-flop; and
the PF detector further comprises reset logic for resetting each flip-flop of the data modules if both the UP and DOWN control signals are in the first state.

8. The circuit of claim 1, wherein:
the upper branch generates the UP control signal;
when the upper branch is activated, the UP control signal is in a first state; otherwise, the UP control signal is in a second state;
the lower branch generates the DOWN control signal; and
when the lower branch is activated, the DOWN control signal is in a first state; otherwise, the DOWN signal is in a second state.

9. The circuit of claim 8, wherein:
if the UP control signal is in the first state and the DOWN control signal is in the second state, then the charge pump increases the pump current to decrease the delays between the fractional delay signals;
if the UP control signal is in the second state and the DOWN control signal is in the first state, then the charge pump decreases the pump current to increase the delays between the fractional delay signals; and
if the UP and DOWN control signals are in the same state, then the charge pump holds the pump current steady to keep the delays between the fractional delay signals steady.

10. The circuit of claim 8, wherein:
the PF detector further comprises reset logic for resetting the trunk, the upper branch, and the lower branch if both the UP and DOWN control signals are in the first state; and
resetting comprises un-priming and deactivating the trunk, the upper branch, and the lower branch.

11. The circuit of claim 1, wherein the desired phase delay is the period of the input clock signal.

* * * * *